United States Patent [19]
Tsuchida

[11] Patent Number: 5,815,451
[45] Date of Patent: Sep. 29, 1998

[54] DYNAMIC SEMICONDUCTOR MEMORY DEVICE HAVING A PRECHARGE CIRCUIT USING LOW POWER CONSUMPTION

[75] Inventor: Kenji Tsuchida, Kawasaki, Japan

[73] Assignee: Kabushiki Kaisha Toshiba, Kawaski, Japan

[21] Appl. No.: 919,240

[22] Filed: Aug. 28, 1997

[30] Foreign Application Priority Data

Nov. 19, 1996 [JP] Japan .................................. 8-308104

[51] Int. Cl.⁶ ............................ G11C 7/00; G11C 11/24; G11C 8/00
[52] U.S. Cl. ...................... 365/203; 365/149; 365/230.03
[58] Field of Search .............................. 365/203, 230.03, 365/149

[56] References Cited

U.S. PATENT DOCUMENTS 5,631,872  5/1997  Naritake et al. ........................ 365/203

FOREIGN PATENT DOCUMENTS

4-184787  7/1992  Japan .

Primary Examiner—David C. Nelms
Assistant Examiner—David Lam
Attorney, Agent, or Firm—Banner & Witcoff, Ltd.

[57] ABSTRACT

There is provided a DRAM using a low electric power consumption characteristic of a VCC/2 precharging method and capable of performing stable and high speed sensing operation even under a low power supply voltage condition. The DRAM has a memory cell array, a plurality of word lines, a plurality of bit line pairs, sense amplifiers disposed to correspond to the bit line pairs, a first precharge circuit for precharging the bit line pairs in the first group of two groups obtained by dividing the plural bit line pairs to a first precharge potential between ½ of power supply voltage Vcc and the ground potential, a second precharge circuit for precharging the bit line pairs in the second group to a second precharge potential which is higher than Vcc/2 by a degree corresponding to the difference between Vcc/2 and the first precharge potential and a precharge control circuit for causing the first and second precharge circuits to sequentially perform corresponding precharge operations with the time difference.

15 Claims, 8 Drawing Sheets

DYNAMIC SEMICONDUCTOR MEMORY DEVICE HAVING A PRECHARGE CIRCUIT USING LOW POWER CONSUMPTION

BACKGROUND OF THE INVENTION

The present invention relates to a dynamic semiconductor memory device, and more particularly to a bit-line sense amplifier circuit for detecting/amplifying the difference between the potentials of bit lines in each of pairs in a dynamic random access memory (DRAM) and a bit-line precharge/equalizing circuit for precharging/equalizing the bit line pairs.

DRAMs have been integrated most densely among MOS semiconductor memories because DRAMs comprise dynamic memory cells each having a relatively simple structure. Thus, mass production of 64-megabit DRAMs will start before long. Moreover, experimental manufacture of 1 giga-bit DRAMs has been disclosed. The above-mentioned rise in the degree of integration has been caused from, for example, progress of the precise processing technology.

On the other hand, the precise process of the device raises a necessity of lowering power supply voltage VCC which is applied to the device in order to maintain the reliability of the device. For example, the generation of the 16 mega-bit DRAMs results in shift of the conventional level of VCC=5V to VCC=3.3V. Moreover, production of DRAMs corresponding to VCC=2.5V is expected in the future generation of 256 mega-bit DRAMs.

In the future generation of the 1 giga-bit DRAMs which require a minimum processing dimension of about 0.15 μm, the power supply voltage is considered to be lowered to a level of about VCC=1.5V.

Since the amount of signal charges stored in each memory cell of the DRAM is usually small, a sensitive bit-line sense amplifier must be provided to detect and amplify the charge so as to read the same to the outside.

The bit-line sense amplifier usually comprises a dynamic differential amplifying circuit composed of an NMOS sense amplifier formed by cross-couple-connecting two NMOS transistors and a PMOS sense amplifier formed by cross-couple-connecting two PMOS transistors.

As the precharge voltage for the bit lines connected to an input terminal of the sense amplifier, a VCC/2 precharging method which uses ½ of the power supply voltage is usually employed.

The characteristic of the VCC/2 precharging method will briefly be described.

In a precharge cycle in which signal /RAS (a row address strobe) which is one of external control signals is the "H" level, the bit line pair is precharged to VCC/2.

When the /RAS has been shifted from "H" level to "L" level and thus the DRAM has been brought to an active mode, the precharge is interrupted and the bit lines are brought to a floating state. Word lines selected in accordance with the external input addresses are operated so that data on the memory cells selected and operated by the word lines are read onto the bit lines.

Then, the bit-line sense amplifier is activated so that small difference in the potential read onto the bit line is detected and amplified. Specifically, the "L" level line of the bit line pair is discharged to the ground potential VSS by an NMOS sense amplifier, while the "H" level line of the bit line pair is charged to the power supply voltage VCC by a PMOS sense amplifier.

After the reading operation has been completed, the potential of the bit lines is equalized so as to be again precharged to the potential VCC/2.

The DRAM of a type using the above-mentioned VCC/2 precharging method encounters a fact that the voltage (VCC/2) between the gate and the source of a transistor forming the sense amplifier (hereinafter called a "sense amplifier transistor") inevitably lowers during the sense amplifier operation. As a result, there is a risk that the sensing operation (the sensing time period) is considerably delayed (elongated). If the worst comes to the worst, the sensing operation cannot be performed.

Specifically, if VCC=1.5V, only ½·VCC=0.75V is applied between the gate and the source of the sense amplifier transistor. In actual, voltage drop occurs due to the resistance of the common source electric line for the sense amplifier transistor. When the initial sensing operation is performed, the voltage between the gate and the source of the sense amplifier transistor is considered to be reduced furthermore (by about 0.5V).

On the other hand, the absolute value |Vth| of threshold voltage Vth (which is a positive value for the NMOS sense amplifier and a negative value for the PMOS transistor) of the sense amplifier transistor must be about 0.3V to about 0.5V or higher in order to maintain the cut-off characteristic.

Moreover, the actual |Vth| is further raised because of the back gate effect of the sense amplifier transistor in the initial sensing operation. Therefore, the voltage between the gate and the source of the sense amplifier transistor and the threshold voltage approach extremely when the initial sensing operation is performed. As a result, the initial sensing operation speed becomes considerably longer, thus causing a high speed DRAM to be inhibited from being realized.

Figure 1:
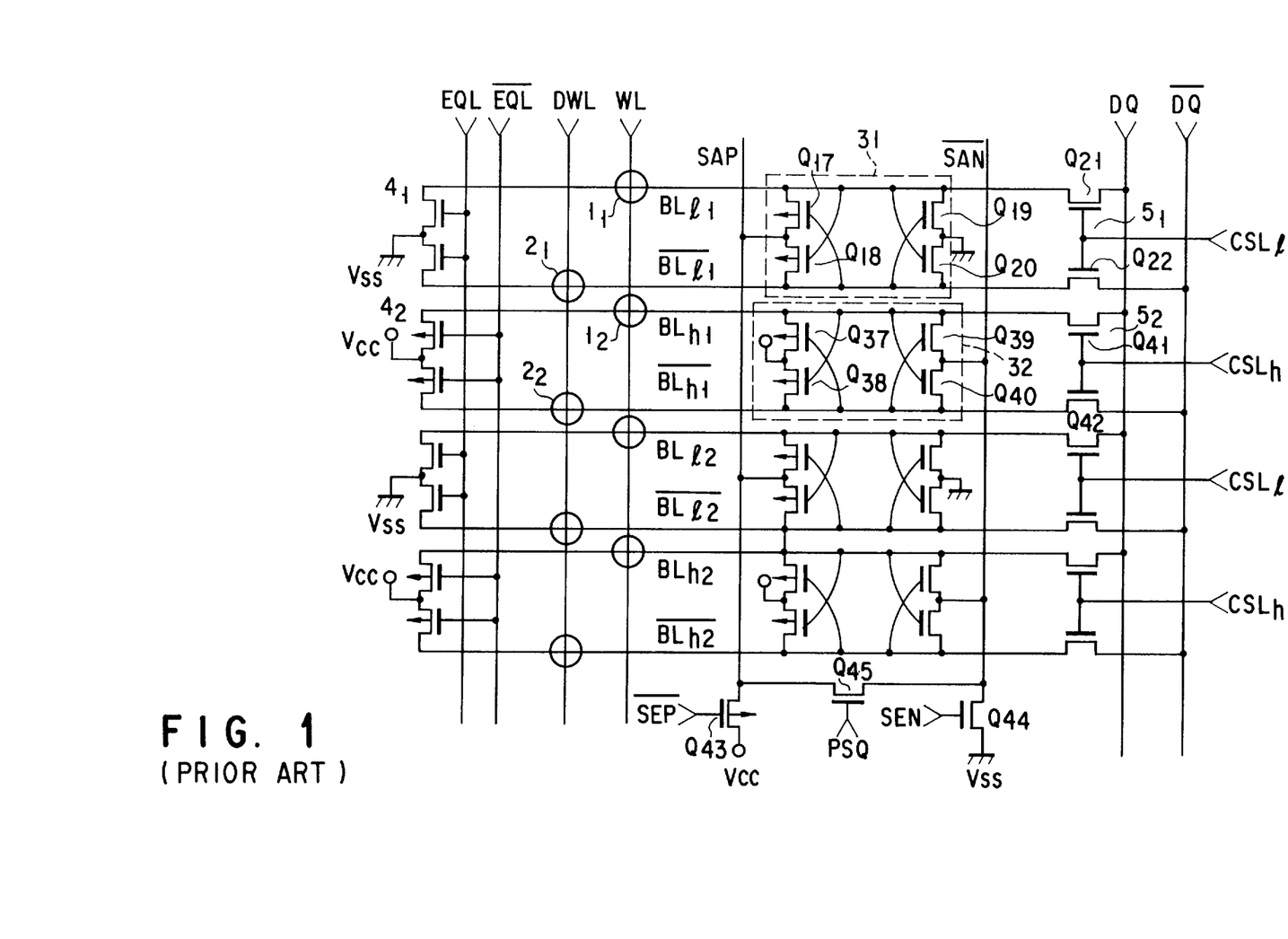
FIG. 1 is a circuit diagram showing the structure of an essential portion of a core circuit in a conventional DRAM.
Figure 2:
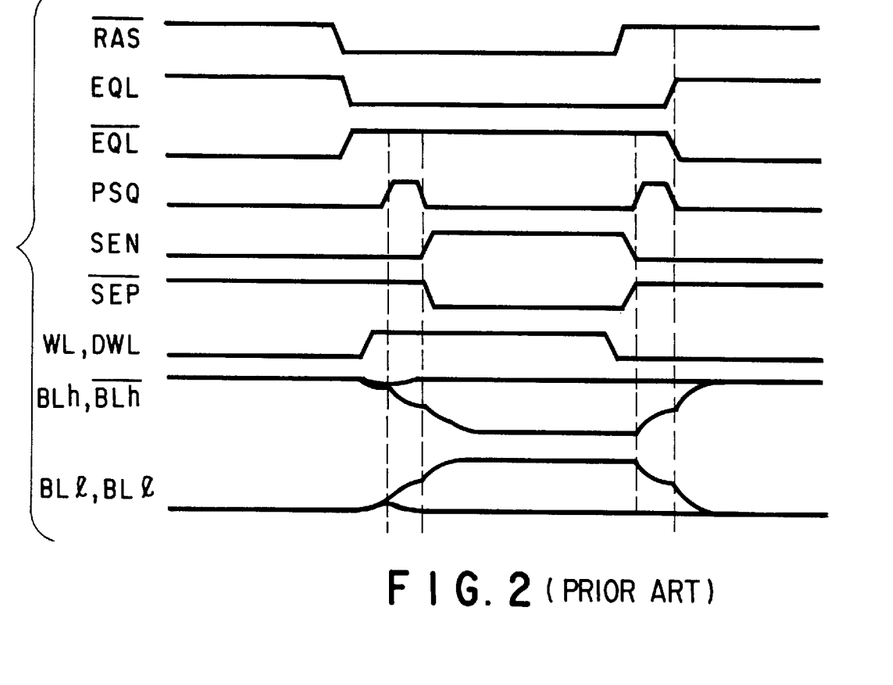
FIG. 2 is a timing waveform graph showing a first example of the operation of the circuit shown in FIG. 1.

As one of methods capable of overcoming the foregoing problem, a method has been disclosed in Jpn. Pat. Appln. KOKAI Publication No. 4-184787. An equivalent circuit of an essential core portion of a first embodiment of the disclosed invention is shown in FIG. 1 and operation waveforms (a timing chart) of the same are shown in FIG. 2.

The first embodiment has two essential portions. One of the essential portions is a structure arranged such that the bit line group is divided into two sections so as to one (a first group) of the sections is precharged to the ground voltage VSS and the other one (a second group) is precharged to the power supply voltage VCC. When the sensing operation is performed, a charge transfer gate Q45 connected between a sense amplifier drive line SAP for a sense amplifier 31 in the first group and a sense amplifier drive line /SAN of a sense amplifier 32 in the second group is turned on in response to signal PSQ so that the drive lines SAP and /SAN are short-circuited. When shift of the charge has been completed, the sense amplifier drive transistors Q43 and Q44 are turned on in response to sense amplifier drive signals /SEP and SEN so as to activate the sense amplifiers 31 and 32. Thus, the sensing operation is performed.

A second characteristic will now be described. The precharging operation is performed such that the sense amplifier drive transistors Q43 and Q44 are deactivated. Then, the charge transfer gate Q45 is turned on in response to the above-mentioned signal PSQ so that the sense amplifier drive lines SAP and /SAN are short-circuited. As a result, the charges of the "H" side bit line of the bit line pair required to be precharged to VSS are shifted to the "L" side bit line of the bit line pair required to be precharged to VCC. Then, the bit lines are operated to the normal precharge potential.

As a result of the above-mentioned two characteristics, a method can be realized which is capable of doubling the voltage between the gate and the source of the sense amplifier transistor which greatly contributes to the operation speed of the sense amplifier even with a similar electric power consumption to that required for the conventional VCC/2 precharging method.

However, even if the above-mentioned method is employed, only the voltage of VCC/2 is applied between the gate and the source of the sense amplifier transistor when the initial sensing operation is performed. Therefore, the time delay of the initial sensing operation required to read the DRAM at high speed cannot be prevented.

Figure 3:
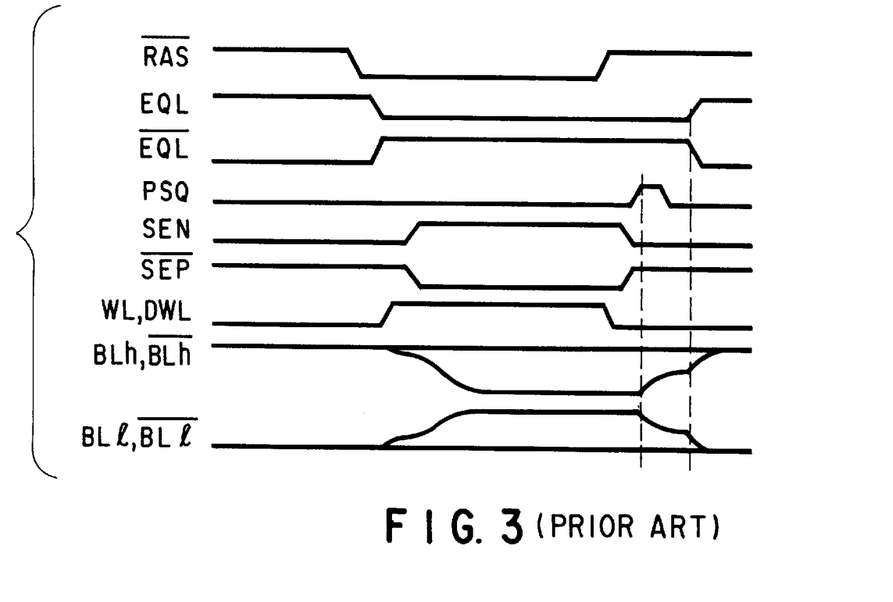
FIG. 3 is a timing waveform graph showing a second example of the operation of the circuit shown in FIG. 1.

As a method capable of overcoming the above-mentioned problem, the method disclosed in Jpn. Pat. Appln. KOKAI Publication No. 4-184787 has a second embodiment in which the charge transfer gate Q45 is turned off (the short circuit between SAP and /SAN is not performed) in response to the signal PSQ when the initial sensing operation is performed as shown in FIG. 3. Moreover, the sense amplifier drive transistors Q43 and Q44 are turned on in response to the sense amplifier drive signals /SEP and SEN so as to activate the sense amplifiers 31 and 32.

However, the second embodiment, in which the charges are not effectively moved when the sensing operation is performed, has a problem in that the amount of the electric current for charging/discharging the bit line required when the sensing operation is performed is enlarged by 50% as compared with the first embodiment.

That is, if the high density DRAM having microdevices integrated thereon employs the conventional VCC/2 precharging method, there arises a problem in that the operation speed of the sense amplifier becomes longer excessively when a low power supply voltage level is used which will be used in the future.

Another problem arises in that the amount of the electric current for charging/discharging the bit lines is increased excessively as compared with the VCC/2 precharging method if the conventional method is employed in which the voltage between the gate and the source of the sense amplifier transistor is raised when the initial sensing operation is performed which considerably affects the operation speed of the DRAM.

BRIEF SUMMARY OF THE INVENTION

As described above, a DRAM adapted to the conventional VCC/2 precharging method has a problem in that the sense amplifying operation deteriorates excessively when the power supply voltage will be lowered in the future. If the conventional method is employed in which the voltage between the gate and the source of a sense amplifier transistor in the initial sensing operation which is significantly important for the operation speed of the DRAM is raised, a problem arises in that the amount of the electric current for charging/discharging the bit lines is increased as compared with the VCC/2 precharging method.

An object of the present invention is to solve the above-mentioned problem and to provide a DRAM capable using the low electric power consumption characteristic of the VCC/2 precharging method and performing a stable and high speed sensing operation even under a low power supply voltage condition.

According to one aspect of the present invention, there is provided a DRAM comprising a memory cell array; a plurality of word lines for selecting and operating the memory cells of the memory cell array; a plurality of bit line pairs for supplying/receiving data to and from selected memory cells of the memory cell array; bit-line sense amplifiers disposed to correspond to the bit line pairs; a first precharge circuit disposed to correspond to the bit line pairs in a first group of two groups obtained by dividing the plural bit line pairs into two sections so as to precharge the bit line pairs in the first group to a first precharge potential between ½ of the power supply voltage and the ground potential; a second precharge circuit disposed to correspond to the bit line pairs in the second group of the two groups obtained by dividing the plural bit line pairs into the two sections so as to precharge the bit line pairs in the second group to a second precharge potential higher than ½ of the power supply voltage by a degree which is the difference between ½ of the power supply voltage and the first precharge potential; and a precharge control circuit for causing the first precharge circuit and the second precharge circuit to sequentially perform the corresponding precharge operations with a time difference.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring to the drawings, embodiments of the present invention will now be described.

Figure 4:
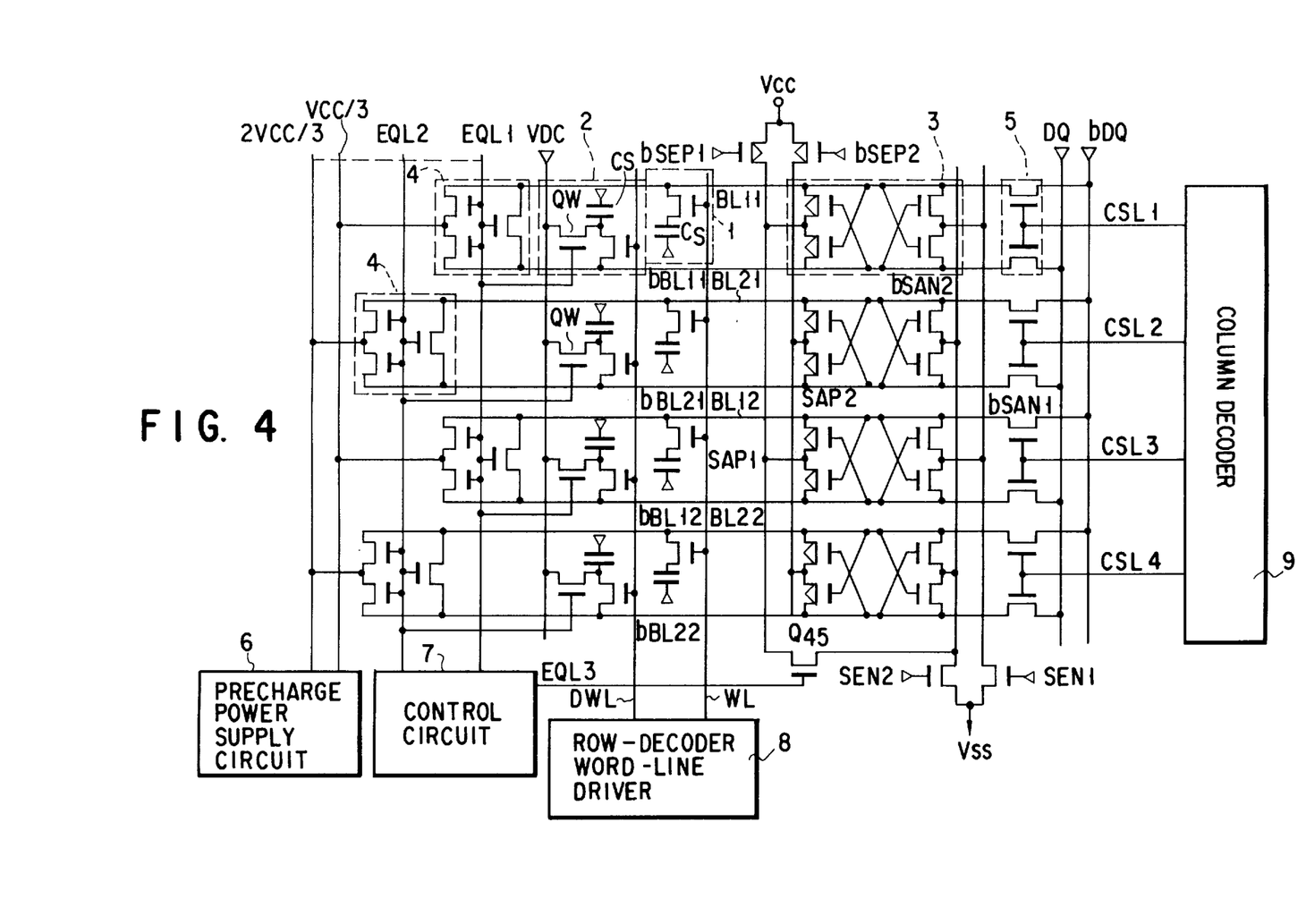
FIG. 4 is a circuit diagram showing the structure of an essential portion of a core circuit of a DRAM according to a first embodiment of the present invention.
Figure 5:
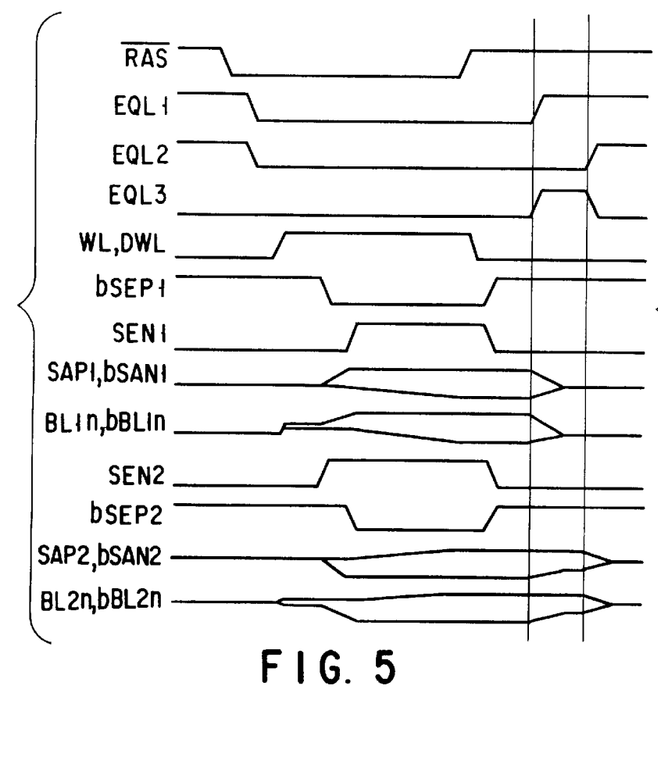
FIG. 5 is a timing waveform graph showing an example of the operation of the circuit shown in FIG. 4.

(1) First Embodiment (see FIGS. 4 and 5)

FIG. 4 is a diagram showing an essential portion of a core circuit in a DRAM according to a first embodiment of the present invention. The DRAM shown in FIG. 4, similarly to the DRAM described with reference to FIG. 1, comprises a memory cell array having a plurality of DRAM memory cells 1 integrally formed and disposed in the form of a matrix configuration.

The memory cell array has a structure formed such that a plurality of word lines for selecting and operating memory cells and plural bit line pairs for supplying/receiving data to and from memory cells are formed to intersect one another. Moreover, the memory cells are disposed at intersections of bit lines and word lines.

FIG. 4, for simplifying the illustration, shows only four bit line pairs (BL11, bBL11), (BL12, bBL12), (BL21, bBL21) and (BL22 and bBL22), four memory cells 1 connected to one word line WL and four dummy cells 2 connected to one dummy word line DWL.

Each bit line pair is provided with a bit-line sense amplifier 3 (which is, in this embodiment, composed of a pair consisting of a PMOS sense amplifier and an NMOS sense amplifier) for detecting/amplifying difference between the potentials of the bit lines of the corresponding pair which is generated attributable to the selective operation of the memory cell performed through the word line so as to read data from the memory cell. Moreover, each bit line is connected to a data line pair (DQ and bDQ) through a column selection gate 5 for, to the outside, outputting data on the bit line pair selected in accordance with decode output CSLi from the column address.

In addition, the bit line pairs are divided into two groups, one of which is, through a bit-line equalizing circuit 4, precharged to VCC/3 (hereinafter called a "first precharge potential") corresponding to the potential which is ⅓ of the power supply voltage. A second group is, through the bit-line equalizing circuit 4, precharged to 2VCC/3 (hereinafter called a "second precharge potential") corresponding to the potential which is ⅔ of the power supply voltage.

The bit-line equalizing circuit 4 for the first group and the bit-line equalizing circuit 4 for the second group are controlled in response to corresponding equalization control signals EQL1 and EQL2. When /RAS precharge is performed, the levels of the signals EQL1 and EQL2 are made to be "H". As a result, each bit line pair is precharged to a required potential.

Moreover, an NMOS transistor QW for writing data and controlled in response to the bit line equalization control signals EQL1 and EQL2 for the corresponding groups is connected to the dummy cell 2 so that VDC (which is VCC/2 in this embodiment) is written when precharging is performed.

On the other hand, common source lines for the PMOS sense amplifier of the bit-line sense amplifier 3 and those for the NMOS sense amplifier are divided into common source lines SAP1 and bSAN1 for the first group and common source lines SAP2 and bSAN2 for the second group to correspond to the two bit line pair groups.

The common source lines SAP1 and SAP2 are activated by a PMOS sense amplifier drive circuit which is operated in response to signals bSEP1 and bSEP2. The common source lines bSAN1 and bSAN2 are activated by an NMOS sense amplifier drive circuit which is operated in response to signals SEN1 and SEN2.

Between the common source line SAP1 for the PMOS sense amplifier of the first group and the common source line bSAN2 of the NMOS sense amplifier of the second group, there is disposed a NMOS transistor Q45 for a charge transfer gate arranged to short-circuit the signal lines SAP1 and the bSAN 2 to each other so as to transfer the charge. The gate of the NMOS transistor Q45 is supplied with a third equalizing signal EQL3.

Although FIG. 4 shows two pairs of bit line pairs corresponding to the first and second groups, an actual DRAM has a structure comprising a plurality of bit line pairs each of which has the basic structure shown in FIG. 4 and which are divided into the corresponding groups.

Referring to FIG. 4, reference numeral 6 represents a power supply circuit (a precharge power supply circuit) for precharging the bit line and 7 represents a control circuit for supplying the equalizing signals EQL1 to EQL3. Similarly to the usual DRAM, the DRAM according to the present invention comprises a row decoder word line driver 8 for decoding a row address signal output from an address buffer circuit (not shown) for receiving external address to select and drive an arbitrary word line, a column decoder 9 for decoding a column address signal output from the address buffer circuit to select and instruct an arbitrary column selection switch, an output buffer circuit (not shown) for outputting data read from the memory cell and then detected and amplified, an input buffer circuit (not shown) for receiving data supplied from outside, and a clock generator and the like (not shown) for generating various control signals.

The operation of the DRAM having the structure shown in FIG. 4 will now be described with reference to a timing chart shown in FIG. 5.

When /RAS has been shifted from "H" to "L" and thus a /RAS active state has been realized, the bit line equalization control signals EQL1 and EQL2 are made to be "L". Thus, the bit line is brought to a floating state.

Then, the word line WL and the dummy word line DWL selected in accordance with the external address are operated so that data is read from the memory cell and the dummy cell onto the bit line.

Assuming that VCC has been written on all of the memory cells as "H" data, the potentials (for example, potentials VBL11 and VbBL11 of the bit line pairs BL11 and bBL11) of the bit line pair in the first group precharged to VCC/3 are obtained as follows by using a charge distribution rule such that the capacity of the bit line is assumed to be CB and the capacity of each of the memory cell 1 and the dummy cell 2 is assumed to be CS:

$$VBL11 = VCC \times \{(CB/3) + CS\}/(CB + CS) \quad (1)$$

$$VbBL11 = VCC \times \{(CB/3) + (CS/2)\}/(CB + CS) \quad (2)$$

Moreover, the potentials (for example, potentials VBL21 and VbBL21 of the bit line pair BL21 and bBL21) of the bit lines in the second group precharged to 2VCC/3 are obtained as follows:

$$VBL21 = VCC \times \{(2CB/3) + CS\}/(CB + CS) \quad (3)$$

$$VbBL21 = VCC \times \{(2CB/3) + (CS/2)\}/(CB + CS) \quad (4)$$

Therefore, the difference between the potentials of the bit lines in one pair can be obtained from the difference between the results of calculations performed in accordance with Equations (1) and (2) and that between the results of calculations performed in accordance with Equations (3) and (4). The difference in the potential between bit lines of each group, that is, signal voltage Vsignal which is supplied to the bit-line sense amplifier 3 is made to be as follows:

$$V_{signal} = VCC \times CS/2 \, (CB+CS) \quad (5)$$

Since the capacity of the memory cell 1 and that of the dummy cell 2 are made to be the same value of CS and the potential corresponding to Vcc/2 is employed as the writing voltage VDC for the dummy cell 2, the level of the signal voltage Vsignal obtainable from Equation (5) is made to be constant regardless of the storage logic of the memory cell 1.

After the word line WL has been activated, sense amplifier activating signals bSEP1 for the first group and SEN2 for the second group are activated so that SAP1 of the common source lines for the sense amplifier in the first group is operated to the power supply voltage and the bSAN2 in the second group is operated to the ground voltage.

Thus, potential 2VCC/3 which is ⅔ of the power supply voltage is applied between the gate and the source of the sense amplifier transistor connected to the bit line pair of the first group or the bit line pair of the second group.

As a result, voltage raised by 33% is applied as compared with the conventional precharging method using potential level of VCC/2 (the voltage between the gate and the source of the sense amplifier transistor is VCC/2 in this case). Therefore, a high speed sensing operation can be performed even under a low power supply voltage condition.

After the above-mentioned initial sensing operation has been performed, the sense amplifier activation signals SEN1 for the first group and bSEP2 for the second group are activated. Thus, the common source lines bSAN1 of the sense amplifier of the first group and SAP2 of the sense amplifier of the second group are operated to the corresponding levels of ground potential and the power supply potential. As a result, the "L" level bit line in each pair is operated to the ground voltage and the "H" level line in each pair is operated to the power supply voltage so that memory cell data is again written.

When /RAS is again shifted to "H" and a /RAS precharged state is realized, the word line WL is returned to a non-selected state. Then, the sense amplifier activating signals bSEP1, SEN2, SEN1 and bSEP2 are deactivated, and then the equalization control signal EQL1 for the first group is shifted to "H" so that the bit line pair of the first group is short-circuited.

Simultaneously, also the third equalization control signal EQL3 is shifted to "H" so that the sense amplifier drive lines SAP1 and bSAN2 are short-circuited through the NMOS transistor Q45. As a result, one of the bit lines of the bit line pair of the second group which has been brought to "L" (the ground potential) in the sensing period is short-circuited with the bit line pair of the first group.

That is, in view of a minimum unit of the apparatus, one bit line (one of the bit lines of the bit line pair of the first group) operated to the power supply voltage and the two bit lines (another bit line of the bit line pair of the first group and one of the bit lines of the bit line pair of the second group) operated to the ground potential are simultaneously short-circuited. As a result, simple shift of the charge causes the potential of VCC/3 to be generated in the above-mentioned three bit lines.

Simultaneously with a moment at which the equalization control signal EQL2 for the second group is made to be "H", the third equalization control signal EQL3 is shifted to "L". As a result, the bit line pair of the second group is equalized. Since one of the bit lines of the bit line pair of the second group which has been, as described above, shifted to "L" in the sensing period has been set to the potential of VCC/3 as a result of the previous equalizing operation, the foregoing bit line is short-circuited with the other bit line of the bit line pair of the second group which has been operated to "H" (the power supply potential). Therefore, simple shift of the charge causes the potential of 2VCC/3 to be generated in the bit line pair of the second group.

As described above, the bit lines are equalized in two steps in the precharging operation so that the precharge potential of VCC/3 and the precharge potential of 2VCC/3 are generated only by the shift of the charge. As a result, supply of the charge from the power source is not required in the precharge cycle.

When /RAS is active, the "H" side of the bit lines of the first group are operated to ⅓ of the power supply voltage and the "H" side of the bit lines of the second group are operated to about ⅔ of the power supply voltage. As a result, electric power consumption required when the bit lines are charged is made to be the same as that required for the precharge method using VCC/2. Thus, electric power consumption can be reduced.

As described above, the first embodiment is able to use the small electric power consumption characteristic of the VCC/2 precharging method and raise the voltage between the gate and the source of the sense amplifier transistor by 33% as compared with the VCC/2 precharging method.

That is, a first characteristic of the first embodiment is a structure arranged such that all of the bit line pairs, which are activated in one cycle, are divided into two groups; and the precharging potential of the bit lines in the first group is set to be VCC/3 and that in the second group is set to be 2VCC/3.

As a result, the sense amplifier drive lines (the common source lines for the bit-line sense amplifier 3) SAP1 and bSAN1 connected to the bit lines of the first group are operated to VCC and VSS and the sense amplifier drive lines (the common source lines for the bit-line sense amplifier 3) SAP2 and bSAN2 connected to the bit lines of the second group are operated to VCC and VSS so that the voltage between the gate and the source of all of the sense amplifier transistors relating to the initial sensing operation can be raised to 2VCC/3.

A second characteristic of the first embodiment is that precharging of the bit lines is performed in two steps so that voltages corresponding to the potential (VCC/3) for precharging the bit lines in the first group and the potential (2VCC/3) for precharging the bit lines in the second group are generated by only the shift of the charges of the bit lines. As a result, electric power consumption required when the bit lines are charged/discharged can be reduced.

The foregoing two characteristics are combined with each other so that the voltage between the gate and the source of the sense amplifier transistor which is an important factor for performing the sensing operation can be raised by 33% with the same electric power consumption as compared with the conventional VCC/2 precharging method. Therefore, a stable and high speed sense circuit adapted to a low electric power consumption method can be provided even under a future low power supply voltage condition.

Figure 6:
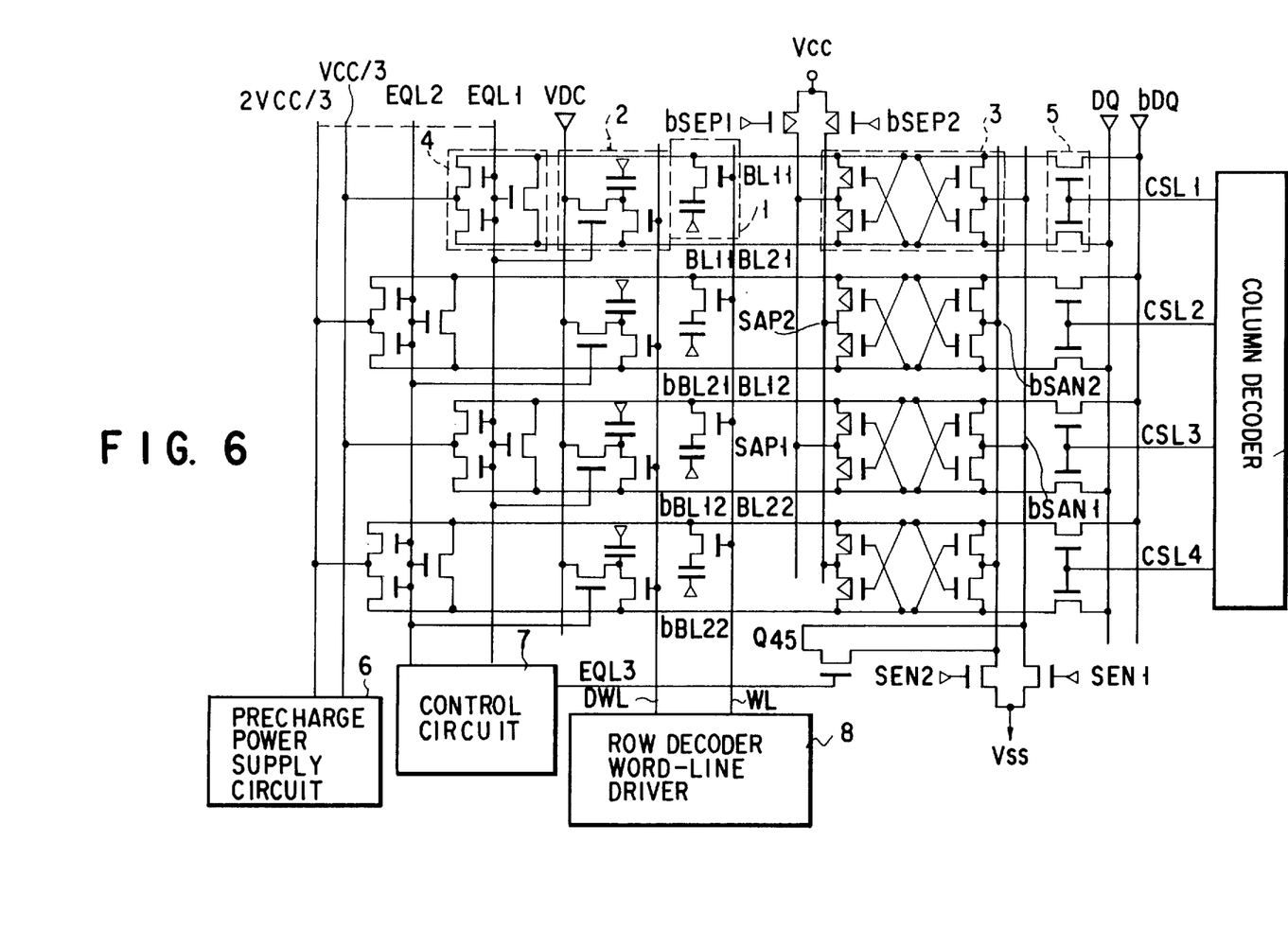
FIG. 6 is a circuit diagram showing the structure of an essential portion of a core circuit of a DRAM according to a second embodiment of the present invention.

(2) Second Embodiment (see FIGS. 5 and 6)

A second embodiment is different from the first embodiment having the structure shown in FIG. 4 and the operation timing shown in FIG. 5 in the structure of a circuit for, in the precharge cycle, generating the potential for precharging the bit lines in the first group prior to generating the potential for precharging the bit lines in the second group.

That is, as shown in FIG. 6, a charge transfer gate Q45 is disposed between the common source line bSAN2 of the NMOS sense amplifier connected to the bit line pair in the second group and the common source line bSAN1 of the NMOS sense amplifier connected to the bit line pair in the first group. Also in this case, the operation is performed at the same timing as that shown in FIG. 5. Thus, an effect similar to that obtainable from the first embodiment can be obtained.

Figure 7:
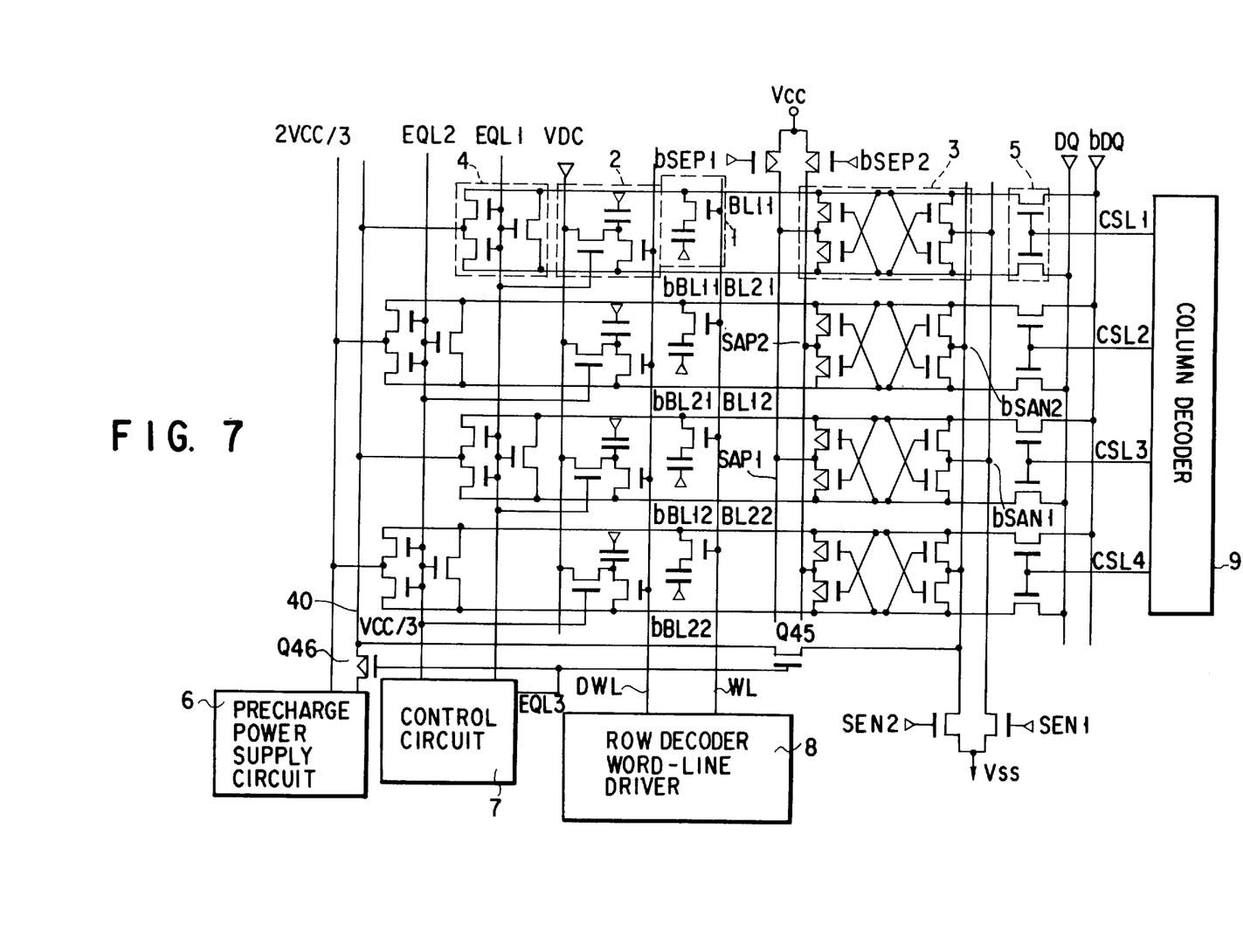
FIG. 7 is a circuit diagram showing the structure of an essential portion of a core circuit of a DRAM according to a third embodiment of the present invention.

(3) Third embodiment (see FIGS. 5 and 7)

A third embodiment is different from the first and second embodiments in the structure of a circuit for, in the precharge cycle, generating the potential for precharging the bit lines in the first group prior to generating the potential for precharging the bit lines in the second group.

That is, as shown in FIG. 7, a charge transfer gate Q45 is disposed between the common source electric line bSAN2 of the NMOS sense amplifier connected to the bit lines in the second group and a first precharge power supply line 40 connected to the bit-line equalizing circuit 4 in the first group.

In this case, a PMOS transistor Q46 is added to a position between the first precharge power supply line 40 and the first precharge power source (the bit line precharge potential generating circuit for the first group). Moreover, the third equalization control signal EQL3 is supplied to the gate electrode of the PMOS transistor Q46. Thus, the PMOS transistor Q46 is turned off in the period in which the charge transfer gate Q45 is activated so that the connection between the first bit-line precharge circuit 4 and the first precharge power source is disconnected.

As a result of the above-mentioned structure, the charge supply path from the first precharge power source can be made non-conductive and only the shift of the charge of the bit line enables the bit line precharge voltage for the first group to be generated.

Also in this case, the operation can be performed as the same timing as that shown in FIG. 5 and an effect similar to that obtainable from the first and second embodiments can be obtained.

Figure 8:
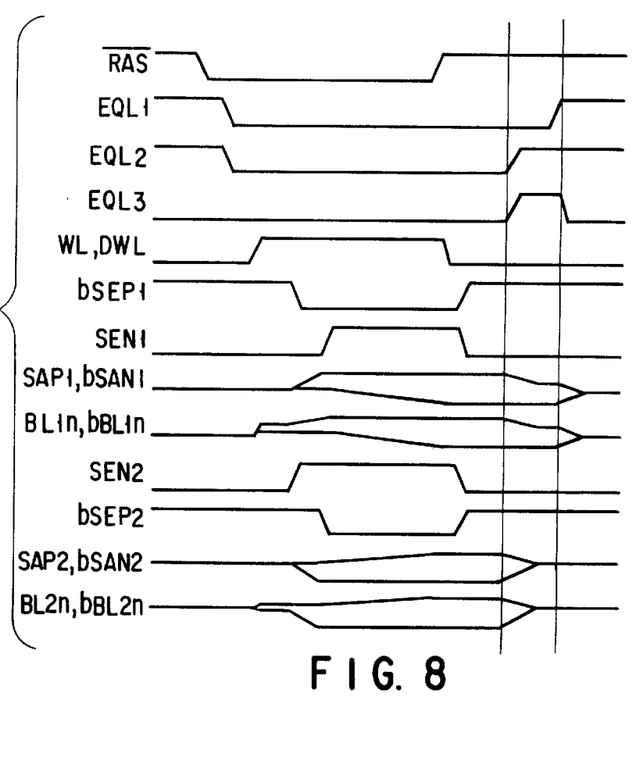
FIG. 8 is a timing waveform graph showing an example of the operation of the core circuit of a DRAM according to a fourth embodiment of the present invention.

(4) Fourth Embodiment (see FIGS. 4 and 8)

A fourth embodiment has the core circuit having the same structure as that according to the first embodiment having the structure shown in FIG. 4 and the operation timing shown in FIG. 5. However, the fourth embodiment is different from the first embodiment in the operation timing. Moreover, the generating order of the bit line precharge voltage for the first group and the bit line precharge voltage for the second group in the precharge cycle is reversed.

That is, potential of 2VCC/3 corresponding to the bit line precharge potential for the second group is generated in the precharge cycle, and then potential of VCC/3 corresponding to the bit line precharge potential for the first group is generated.

FIG. 8 shows the operation timing according to the fourth embodiment.

The operation timing according to the fourth embodiment is different from the operation timing according to the first embodiment shown in FIG. 5 in that the /RAS precharge cycle is structured such that the equalization control signal EQL2 for the bit lines in the second group is activated prior to activating the equalization control signal EQL1 for the bit lines in the first group.

That is, simultaneously with the shift of the signal EQL2 to "H", the third equalization control signal EQL3 is shifted to "H". Thus, one of the bit lines in the first group which has been operated to "H" in the sensing period is short-circuited with the bit line pair in the second group. As a result, the two bit lines (one of the bit lines of the bit line pair in the first group and one of the bit lines of the bit line pair in the second group) operated to the power supply voltage and one bit line (another bit line of the bit line pair in the second group) operated to the ground potential are short-circuited collectively. As a result, only the shift of the charge enables the potential 2VCC/3 to be generated in the above-mentioned three bit lines.

Simultaneously with the moment at which the equalization control signal EQL1 of the bit line pair in the first group is made to be "H", the third equalization control signal EQL3 is shifted to "L". Thus, the bit line pairs in the first group are equalized. Since one of the bit line pair in the first group which has been operated to "H" (the power supply potential) in the sensing period has been set to the potential 2VCC/3 attributable to the previous equalization operation as described above, it is short-circuited with the other bit line of the bit line pair in the first group which has been operated to "L" (the ground potential) in the sensing period. As a result, only the shift of the charge enables the potential of VCC/3 to be generated in the bit line pairs in the first group.

Also the fourth embodiment attains an effect similar to that obtainable from the first embodiment.

Figure 9:
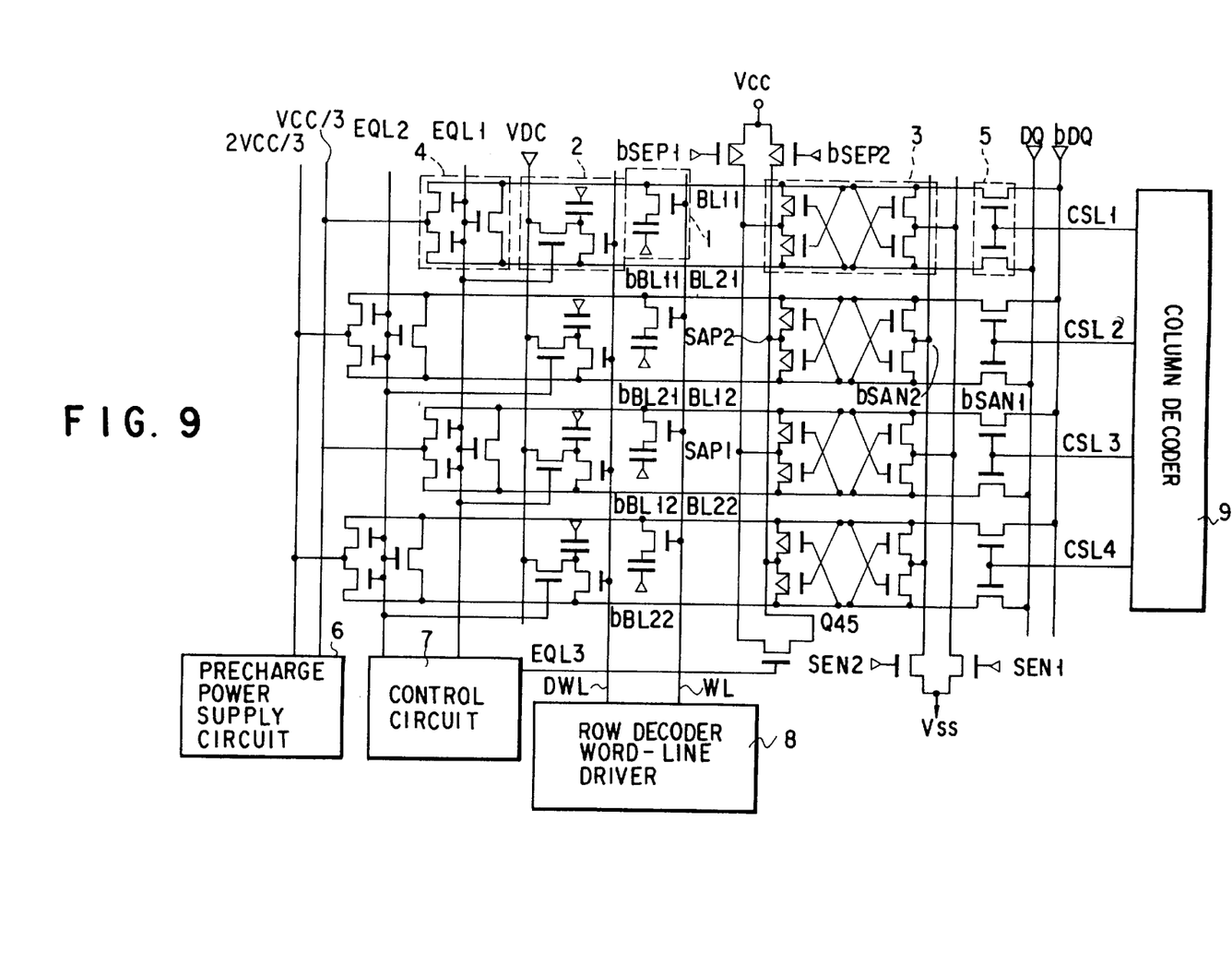
FIG. 9 is a circuit diagram showing the structure of an essential portion of a core circuit of a DRAM according to a fifth embodiment of the present invention.

(5) Fifth Embodiment (FIGS. 8 and 9)

A fifth embodiment is different from the fourth embodiment having the structure shown in FIG. 4 and the operation timing shown in FIG. 8 in that the structure of the circuit for, in the precharge cycle, generating the bit line precharge potential for the second group prior to generating the bit line precharge potential for the first group.

That is, as shown in FIG. 9, a charge transfer gate Q45 is disposed between the common source line SAP1 for the PMOS sense amplifier connected to the bit line pair in the first group and the common source line SAP2 for the PMOS sense amplifier connected to the bit line pair in the second group. Also in this case, the operation can be performed at the same timing as that shown in FIG. 8. Thus, an effect similar to that obtainable from the fourth embodiment can be obtained.

Figure 10:
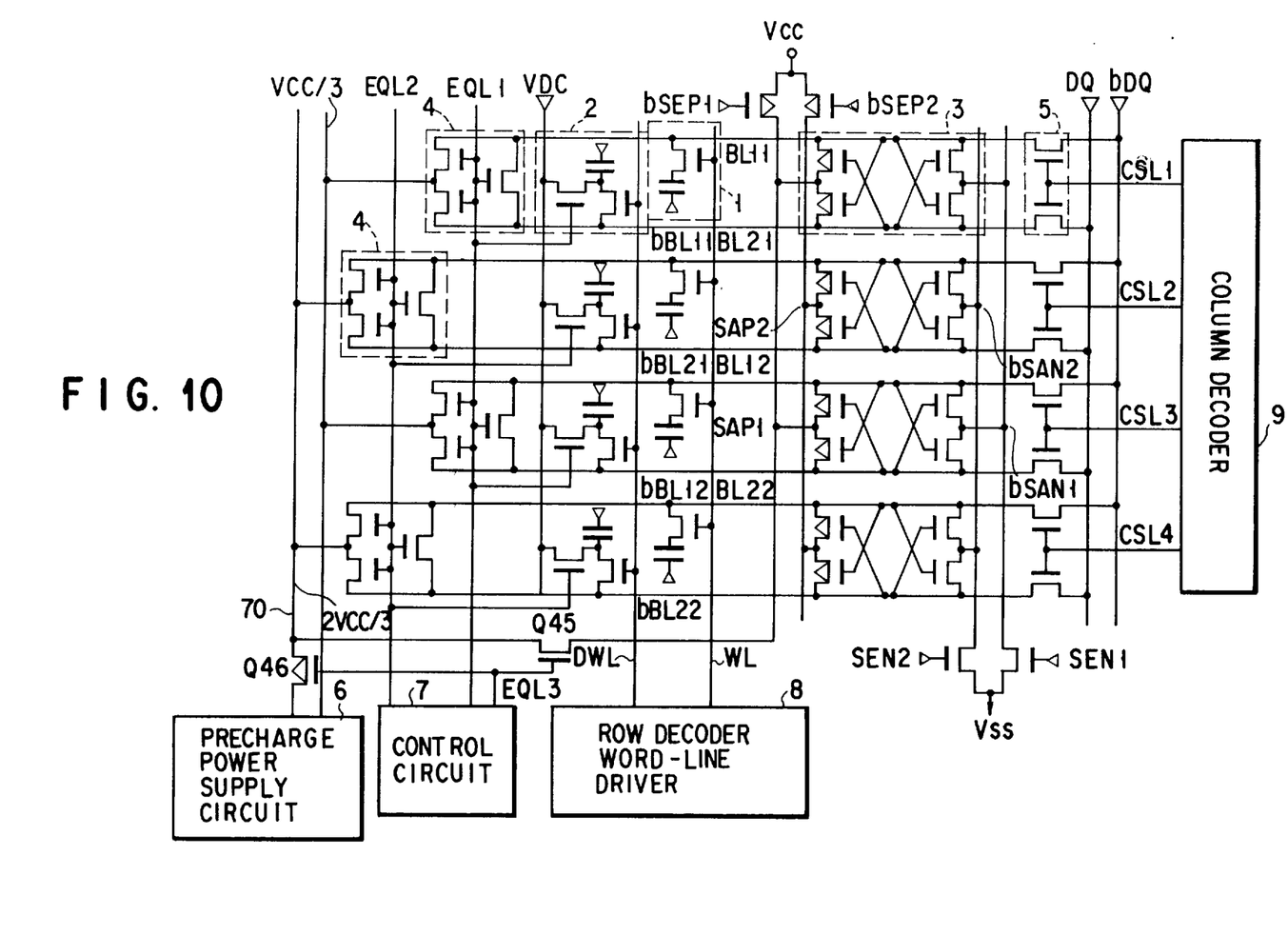
FIG. 10 is a circuit diagram showing the structure of an essential portion of a core circuit of a DRAM according to a sixth embodiment of the present invention.

(6) Sixth Embodiment (see FIGS. 8 and 10)

A sixth embodiment is different from the fourth and fifth embodiments in that the structure of the circuit for generating, in the precharge cycle, the bit line precharge potential for the second group prior to generating the bit line precharge potential for the first group.

That is, as shown in FIG. 10, a charge transfer gate Q45 is disposed between the common source line SAP1 for the PMOS sense amplifier corresponding to the bit lines in the first group and a second precharge power supply line 70 connected to the bit-line precharge circuit 4 in the second group.

In this case, it is preferable that a PMOS transistor Q46 is added between the second precharge power supply line 70 and the second precharge power source (the bit line precharge potential generating circuit for the second group). When the third equalization control signal EQL3 is supplied to the gate electrode of the PMOS transistor Q46, the PMOS transistor Q46 is turned off in a period in which the charge transfer gate Q45 is activated. Thus, the second bit line precharge circuit 4 and the second precharge power source are disconnected.

As a result, the charge supply pass from the second precharge power source is made non-conductive and only the shift of the charge of the bit lines enables the bit line precharge voltage for the second group to be generated.

Also in this case, the operation can be performed at the same timing as that shown in FIG. 8 so that an effect similar to that obtainable from the fourth and fifth embodiments is obtained.

That is, each of the foregoing embodiments has the structure such that all of the bit line pairs which are activated in one cycle are divided into two groups. Moreover, the cycle for precharging the bit line pairs is performed such that the bit lines in the first group are precharged to the potential which is ⅓ of the power supply voltage and those in the second group are precharged to the potential which is ⅔ of the power supply voltage.

When the sensing operation for detecting and amplifying data on the memory cell is performed, the common source line (the sense amplifier drive line) connected to the sense amplifier for the bit lines in the first group are set to be the power supply potential VCC and the common source line (the sense amplifier drive line) connected to the sense amplifier for the bit lines in the second group is set to be the ground potential VSS. Thus, the voltage between the gate and the source of the sense amplifier transistor can be raised to a level which is ⅔ (raised by 33% as compared with the VCC/2 precharging method) of the power supply voltage as compared with the conventional VCC/2 precharging method.

To perform the cycle for precharging the bit lines, two precharge circuits arranged to be operated at different operation timings are provided so as to precharge the bit lines in two steps. That is, the potential corresponding to the potential for precharging the bit lines in the first group or the second group is generated by only the shift of the charge. Then, the potential for precharging the bit lines in the first group or the second group which has not been generated is generated only by the shift of the charge of the bit line. As a result, the electric power consumption required to charge/discharge the bit lines can be made to be the same which is required for the conventional VCC/2 precharging method.

Therefore, a DRAM capable of preventing critical delay of the sensing operation and sensing impossibility which will raise a critical problem in the future low voltage condition while requiring the same electric power consumption as compared with the convention VCC/2 precharging method can be realized.

A plurality of combinations exist which enable a plurality of precharge potentials to be generated by a plurality of precharge operations owning to the shift of the charge. The combination capable of generating the first precharge potential and the second precharge potential by the shift of the charge of the bit line by performing two times of the precharge operations can be realized such that the first precharge potential is set to be a level between ½ of the power supply voltage and the ground potential and the second precharge potential is set to be a level higher than ½ of the power supply voltage by the degree which is the difference between the ½ of the power supply voltage and the first precharge potential.

The combination of the precharge potentials can generally be expressed by an equation to correspond to the basic unit $2^n$ (n is 0 or a positive integer) of the number of columns in the memory cell array:

$$VCC \times (2^n+m)/(2^{n+1}+m) \ \& \ VCC \times 2^n/(2^{n+1}+m) \quad (6)$$

where m is a positive integer satisfying $m \leq 2^n$

Combinations of the potentials for precharging the bit line are as follows:

| | | |
|---|---|---|
| $2^0 = 1$ | ... | 2/3 & 1/3 |
| $2^1 = 2$ | ... | 3/5 & 2/5, 4/6 & 2/6 |
| $2^2 = 4$ | ... | 5/9 & 4/9, 6/10 & 4/10, 7/11 & 4/11, 8/12 & 4/12 |
| $2^3 = 8$ | ... | 9/17 & 8/17, 10/18 & 8/18, 11/19 & 8/19, 12/20 & 8/20, 13/21 & 8/21, 14/22 & 8/22, 15/23 & 8/23, 16/24 & 8/24 |
| $2^4 = 16$ | ... | 17/33 & 16/33, 18/34 & 16/34, 19/35 & 16/35, 20/36 & 16/36, 21/37 & 16/37, 22/38 & 16/38, ... |

The highest level of the voltage between the gate and the source of the sense amplifier transistor which is important for the initial sensing operation is $VCC \times (2^n+m)/(2^n+m)$. The foregoing value is made to be asymptotic 2VCC/3 in proportion to m if the value of n is constant.

Therefore, when the same electric power consumption is maintained at the same quantity as that required for the VCC/2 precharging method, the voltage between the gate and the source of the sense amplifier transistor can be set to the highest level by selecting VCC/3 as the first precharge potential and 2VCC/3 as the second precharge potential as have been employed in each of the foregoing embodiments.

The present invention is not limited to each of the above-mentioned embodiments and various modifications are permitted within the scope of the present invention. Although the conventional examples and the embodiments have been described about the DRAM, the present invention may be applied to another memory, such as a PROM having a dynamic differential amplifier as a bit-line sense amplifier for detecting and amplifying information on the memory cells.

As described above, according to the present invention, there is provided a DRAM capable of using the low electric power consumption characteristic of the VCC/2 precharging method and enabling a stable and high speed sensing operation to be performed even under a low power supply voltage condition.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A dynamic semiconductor memory device comprising:
   a memory cell array having a plurality of dynamic memory cells disposed in a matrix configuration;
   a plurality of word lines for selecting and operating said memory cells of said memory cell array;
   a plurality of bit line pairs for supplying/receiving data to and from selected memory cells of said memory cell array, bit lines of said plurality of bit line pairs being divided into a first group and a second group;
   bit-line sense amplifiers disposed to correspond to said bit line pairs;
   a first precharge circuit disposed to correspond to said bit line pairs in said first group so as to precharge said bit line pairs in said first group to a first precharge potential between ½ of power supply voltage and ground potential;

a second precharge circuit disposed to correspond to said bit line pairs in said second group so as to precharge said bit line pairs in said second group to a second precharge potential higher than ½ of the power supply voltage by a degree which is the difference between ½ of the power supply voltage and the first precharge potential; and a precharge control circuit for causing said first precharge circuit and said second precharge circuit to perform the corresponding precharge operations with a time difference.

2. A dynamic semiconductor memory device according to claim 1, further comprising:

a charge moving circuit for sequentially generating said two types of precharge potentials having different voltages by moving charges of said bit lines.

3. A dynamic semiconductor memory device according to claim 2, wherein said charge moving circuit is activated only in a period of time after a precharge operation of said bit line pairs in said first group has been started until a precharge operation of said bit line pairs in said second group is started.

4. A dynamic semiconductor memory device according to claim 3, further comprising:

a circuit for disconnecting said bit line precharge power source and said bit line equalizing circuit in a period in which said charge moving circuit is activated.

5. A dynamic semiconductor memory device comprising:

a memory cell array having a plurality of dynamic memory cells disposed in a matrix configuration;

a plurality of word lines for selecting and operating said memory cells of said memory cell array;

a plurality of bit line pairs for supplying/receiving data to and from selected memory cells of said memory cell array, bit lines of said plurality of bit line pairs being divided into a first group and a second group;

sense amplifiers disposed to correspond to said bit line pairs and composed of PMOS sense amplifiers and NMOS sense amplifiers for, in a sensing period, detecting and amplifying the difference in the potential generated in said bit line pairs due to a selective operation of said memory cells by said word lines;

a first precharge circuit connected to said bit line pairs in said first group so as to precharge said bit line pairs in said first group in a first precharge period after said sense amplifying period has been completed to a first precharge potential which corresponds to ⅓ of power supply voltage;

second precharge circuit connected to said bit line pairs in said second group so as to precharge said bit line pairs in said second group in a second precharge period having a start timing different from that of said first precharge period to a second predetermined potential which corresponds to ⅔ of the power supply voltage;

a first bit line equalizing circuit connected to said bit line pairs in said first group and arranged to short-circuit said bit line pairs in said first group in said first precharge period;

a second bit line equalizing circuit connected to said bit line pairs in said second group and arranged to short-circuit said bit line pairs in said second group in said second precharge period; and a charge movement passage for a predetermined charge movement in the difference of period between the start timings of said two precharge periods to generate said first precharge potential for one of the bit lines of said bit line pair in said second group or said second precharge potential for one of the bit lines of said bit line pair in said first group.

6. A dynamic semiconductor memory device according to claim 5, wherein said second precharge period is started at a timing earlier than start of said first precharge period, and said charge movement passage moves a charge between low potential bit lines of said bit line pair in said second group and said bit line pair in said first group when said sensing period has been ended so as to make a charge movement in order to generate said first precharge potential for said low potential bit lines.

7. A dynamic semiconductor memory device according to claim 6, wherein said charge movement passage has a charge transfer gate disposed between a common source line for said NMOS sense amplifier connected to said bit line pairs in said second group and a common source line for said PMOS sense amplifier or said NMOS sense amplifier connected to said bit line pairs in said first group so as to be turned on in a period of the time difference between start timings of said two precharge periods.

8. A dynamic semiconductor memory device according to claim 6, wherein said first precharge circuit has a first bit line precharge circuit connected to said bit line pair in said first group and a first precharge power supply line connected between said first bit line precharge circuit and a first precharge power source, and said charge movement passage has a charge transfer gate disposed to a common source line for said NMOS sense amplifier connected to said bit line pairs in said second group and said first precharge power supply line and arranged to be turned on in a period of the time difference between start timings of said two precharge periods.

9. A dynamic semiconductor memory device according to claim 8, further comprising:

a switching device inserted between said first precharge power supply line and said first precharge power source and arranged to be switched off in a period of the time difference between start timings of said two precharge periods.

10. A dynamic semiconductor memory device according to claim 5, wherein said second precharge period is started at a timing earlier than start of said first precharge period, and said charge movement passage moves a charge between high potential bit lines of said bit line pair in said first group and said bit line pair in said second group when said sensing period has been ended so as to make a charge movement in order to generate said second precharge potential for said high potential bit lines.

11. A dynamic semiconductor memory device according to claim 10, wherein said charge movement passage has a charge transfer gate disposed between a common source line for said PMOS sense amplifier connected to said bit line pairs in said first group and a common source line for said PMOS sense amplifier connected to said bit line pairs in said second group so as to be turned on in a period of the time difference between start timings of said two precharge periods.

12. A dynamic semiconductor memory device according to claim 10, wherein said second precharge circuit has a second bit line precharge circuit connected to said bit line pair in said second group and a second precharge power supply line connected between said second bit line precharge circuit and a second precharge power source, and said charge movement passage has a charge transfer gate disposed between a common source line for said PMOS sense amplifier connected to said bit line pairs in said first group and said second precharge power supply line and arranged to be turned on in a period of the time difference between start timings of said two precharge periods.

13. A dynamic semiconductor memory device according to claim 12, further comprising:

a switching device inserted between said second precharge power supply line and said second precharge power source and arranged to be switched off in a period of the time difference between start timings of said two precharge periods.

14. A method of precharging bit lines by reading data from a dynamic semiconductor memory device which includes:

a memory cell array having a plurality of dynamic memory cells disposed in a matrix configuration;

a plurality of word lines for selecting and operating said memory cells of said memory cell array;

a plurality of bit line pairs for supplying/ receiving data to and from selected memory cells of said memory cell array, bit lines of said plurality of bit line pairs being divided into a first group and a second group;

bit-line sense amplifiers disposed to correspond to said bit line pairs;

a first precharge circuit disposed to correspond to said bit line pairs in said first group so as to precharge said bit line pairs in said first group to a first precharge potential between ½ of power supply voltage and ground potential;

a second precharge circuit disposed to correspond to said bit line pairs in said second group so as to precharge said bit line pairs in said second group to a second precharge potential higher than ½ of the power supply voltage by a degree which is the difference between ½ of the power supply voltage and the first precharge potential; and a precharge control circuit for causing said first precharge circuit and said second precharge circuit to perform the corresponding precharge operations with a time difference, wherein the method comprising the following steps:

making the level of a bit-line equalization control signal to be "L" to bring said bit lines in said first and second groups to a floating state;

making a word line and a dummy word line selected in accordance with an external address to be "H" to read data from the memory cell and a dummy cell to said bit line;

shifting a sense amplifier activation signal to an active state to operate one of said bit lines of said bit line pairs in both of said first and second groups to the power supply voltage and other bit lines to the ground voltage to cause said sense amplifier to read cell data;

returning said word line to a non-selected state to bring said sense amplifier activation signal to a deactivated state;

shifting a first equalization control signal to "H" to short-circuit said bit line pairs in said first group;

shifting a third equalization control signal to "H" to short-circuit said bit lines in said first group and one of said bit lines of said bit line pairs in said second group to charge said bit lines in said first group to an average voltage of the three bit lines and connect said bit lines in said first group to said first precharge circuit simultaneously with the electrification;

shifting said third equalization control signal to "L" to disconnect one of said bit lines of said bit line pairs in said second group from said bit line pairs in said first group; and shifting a second equalization control signal to "H" to short-circuit said bit line pairs in said second group to charge said bit line pairs in said second group to an average voltage of two bit lines and connect said bit line pairs in said second group to said second precharge circuit simultaneously with the electrification.

15. A method of precharging bit lines by reading data from a dynamic semiconductor memory device which includes:

a memory cell array having a plurality of dynamic memory cells disposed in a matrix configuration;

a plurality of word lines for selecting and operating said memory cells of said memory cell array;

a plurality of bit line pairs for supplying/receiving data to and from selected memory cells of said memory cell array, bit lines of said plurality of bit line pairs being divided into a first group and a second group;

bit-line sense amplifiers disposed to correspond to said bit line pairs;

a first precharge circuit disposed to correspond to said bit line pairs in said first group so as to precharge said bit line pairs in said first group in a first precharge period after said sense amplifying period has been completed to a first precharge potential which corresponds to 1/3 of power supply voltage;

a second precharge circuit disposed to correspond to said bit line pairs in said second group so as to precharge said bit line pairs in said second group in a second precharge period having a start timing different from that of said first precharge period to a second predetermined potential which corresponds to ⅔ of the power supply voltage; and a precharge control circuit for causing said first precharge circuit and said second precharge circuit to perform the corresponding precharge operations with a time difference, wherein the method comprising the following steps:

making the level of a bit-line equalization control signal to be "L" to bring said bit lines in said first and second groups to a floating state;

making a word line and a dummy word line selected in accordance with an external address to be "H" to read data from the memory cell and a dummy cell to said bit line;

shifting a sense amplifier activation signal to an active state to operate one of said bit lines of said bit line pairs in both of said first and second groups to the power supply voltage and other bit lines to the ground voltage to cause said sense amplifier to read cell data;

returning said word line to a non-selected state to bring said sense amplifier activation signal to a deactivated state;

shifting a first equalization control signal to "H" to short-circuit said bit line pairs in said first group;

shifting a third equalization control signal to "H" to short-circuit said bit line pairs in said first group and one of said bit lines of said bit line pairs in said second group to charge the three bit lines to ⅓ of the power supply voltage and connect the three bit lines to said first precharge circuit simultaneously with the electrification;

shifting said third equalization control signal to "L" to disconnect one of said bit lines of said bit line pairs in said second group from said bit line pairs in said first group; and shifting a second equalization control signal to "H" to short-circuit said bit line pairs in said second group to charge said two bit lines to ⅔ of the power supply voltage and connect said two bit lines to said second precharge circuit simultaneously with the electrification.

* * * * *